United States Patent
Masini et al.

(10) Patent No.: US 6,320,465 B1
(45) Date of Patent: Nov. 20, 2001

(54) CONSTANT DUTY-CYCLE LIMITING OF ANALOG INPUT SIGNAL SWING IN A CLASS-D AMPLIFIER

(75) Inventors: Marco Masini, Milan; Claudio Tavazzani, Trivolzio, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/558,320

(22) Filed: Apr. 25, 2000

(30) Foreign Application Priority Data

Apr. 27, 1999 (EP) .................................................. 99830248

(51) Int. Cl.[7] .................................................. H03F 3/217
(52) U.S. Cl. ...................................... 330/207 A; 330/251
(58) Field of Search ................................. 330/10, 207 A, 330/251

(56) References Cited

U.S. PATENT DOCUMENTS

| | | | |
|---|---|---|---|
| 4,764,734 | * 8/1988 | Schilling et al. | 330/251 |
| 5,525,922 | 6/1996 | Masarik et al. | 327/179 |
| 6,107,875 | * 8/2000 | Pullen et al. | 330/10 |

FOREIGN PATENT DOCUMENTS 0184280 6/1986 (EP) .
0335317 10/1989 (EP) .

OTHER PUBLICATIONS

Morgan, Dennis. "Circuit Uses Only Resistors, Diodes." EDN Electrical Design News, vol. 29, No. 10, May 1984, p. 213, Document No. XP002116288.

* cited by examiner

Primary Examiner—Steven J. Mottola
(74) Attorney, Agent, or Firm—Lisa K. Jorgenson; Allen, Dyer, Doppelt, Milbrath & Gilchrist, P.A.

(57) ABSTRACT

A constant limit duty-cycle is established by detecting the equivalent values VDD' and −VDD" of the voltages to which the output signal of the amplifier switches or pseudo supplies. An input limiting stage receiving an analog input signal utilizes the pseudo supply values VDD' and −VDD" as respective reference values for limiting the voltage swing of the analog signal output to a pre-defined fraction $\alpha < 1$ of such reference values. This avoids using as a reference the real supply voltage values VDD and −VDD, as commonly done. The constant limit duty cycle is substantially independent from fabrication process spreads, temperature, etc., and provides an optimal functioning of the final stage of the amplifier for all working conditions.

32 Claims, 4 Drawing Sheets

CONSTANT DUTY-CYCLE LIMITING OF ANALOG INPUT SIGNAL SWING IN A CLASS-D AMPLIFIER

FIELD OF THE INVENTION

The present invention relates to class-D amplifiers, and, in particular, to integrated Pulse Width Modulation (PWM) audio amplifiers.

BACKGROUND OF THE INVENTION

The demands for reducing power dissipation and optimizing efficiency has recently favored the development and utilization of Pulse Width Modulation (PWM) or Pulse Density Modulation (PDM) class-D amplifiers. This has even been the case for typical analog applications, such as audio and electro-acoustic amplifiers, for example.

According to a common approach, the analog signal is converted into a constant frequency digital signal whose duty-cycle depends on the instantaneous value of the analog input signal. This produces a PWM, or alternatively, a PDM signal whose average value is an amplified signal that is substantially a replica of the analog input signal.

This is normally done by a converter that converts an analog input signal into a digital signal, for example, a PWM or a PDM signal. The converting is done by switching between the positive and negative supply voltages of the circuit. An average value of the digital signal represents an amplified replica of the analog input signal. The reconstruction of the analog signal takes place in an output low pass filter.

A functional scheme of such an amplifier is shown in FIG. 1. The waveform of the output signal Vop is a square wave whose amplitude is equal to the supply voltage. A duty-cycle of the output signal Vop, according to the diagram of FIG. 1, is given by $$D = T1/Tsw = (Tsw-T2)/Tsw$$

which depends on the Vin input signal. The diagram of FIG. 1 represents the case in which the output signal is positive. Therefore, the duty-cycle is greater than 50%.

The average voltage Vo of the reconstructed signal on the load may be calculated as:

$$Vo = (2*D-1)*VDD \quad (1)$$

The average value Vo is obtained from the output voltage Vop of the amplifying stage G by the low pass filter LC. The gain G of the amplifier is given by:

$$G = Vo/Vin \quad (2)$$

Equation (1) shows that for reproducing a positive output voltage Vo that approximates the positive supply value VDD, it is necessary a duty-cycle D approximates 1, and, therefore, a time T2 is close to 0. However, an excessively small interval T2 may cause at least two problems in a class-D amplifier.

A first problem arises because the output switching of the amplifying stage have a finite rate. If $\Delta T$ is the switching time and T2 becomes less than $2\Delta T$, the output waveform is strongly distorted as illustrated in FIG. 2. A B-type switching causes a strong output distortion, and, therefore, a distortion of the audio signal.

A second problem is that with the amplifiers that use a final stage with a bootstrap capacitance, the functioning is correct until the discharge of the capacitance is balanced by the charge of the bootstrap capacitance. Discharge of the capacitance occurs during the time Ti when the output is given by +VDD. The charge of the bootstrap capacitance occurs during the time T2 when the output is low, i.e., at −VDD. If T2 is close to 0, the bootstrap capacitance does not recharge, and, therefore, the functioning of the final stage may be compromised. Reference is directed to U.S. Pat. No. 5,818,209.

To address these problems, it is a common practice to limit the analog input signal Vin between two limiting thresholds. These two limiting thresholds are commonly dependent upon the actual voltages of the respective supply nodes VDD and −VDD.

FIG. 3 shows a complete scheme of a circuit LIMITER that limits the deviations of the analog output voltage VL within a pre-established voltage fraction $\alpha<1$ of the voltages of the two supply rails. The output signal VL of the circuit LIMITER, relative to an input sinusoid, is shown in FIG. 4.

With respect to the maximum output voltage of the limiting stage, VLmax=$\alpha$VDD in terms of modulus, it is possible to establish through equation (1) the maximum duty-cycle Dlimit required by the final stage of the amplifier G. The amplifier is typically formed by a half-bridge stage that includes two power devices, a high-side device switching the output to the positive supply VDD node, and a low-side device switching the output to the negative supply node −VDD.

If G is the amplifier gain, the average voltage of the reconstructed output signal Vo is given by:

$$Vo = G*\alpha*VDD \quad (3)$$

thus, from equation (1)

$$G*\alpha*VDD = (2*Dlimit-1)*VDD \quad (4)$$

and by simplifying:

$$Dlimit = (1+G*\alpha)*0.5 \quad (5)$$

It would appear that by properly selecting the parameters from equation (5), the limit duty-cycle (Dlimit) could be determined.

In reality, equation (5) considers in a first approximation the series resistance of the amplifier's final stage as a null. In contrast, the delivery of current to the load occurs with a voltage drop on the series resistance of the low-side and high-side power devices. When the amplifier is delivering a positive current Io, the duty-cycle is greater than 50% and the output voltage Vop of the amplifying stage G has a characteristic as shown in FIG. 5.

Indeed, VDD' is smaller than VDD by an amount equal to the voltage drop on the series resistance of the high-side power device of the output half-bridge. If Ron is the series resistance of the high-side power device of the final stage and Io is the average output current at a given load of the amplifier, the VDD' voltage is given by:

$$VDD' = VDD - Ron*Io \quad (6)$$

Similar considerations may also be made for a negative output current. The VDD" voltage is equal to the −VDD minus the voltage drop on the low-side device of the final stage. By considering equation (6), it is evident that the apparent supply voltage of the final stage should not be considered fixed to VDD and −VDD, but varying with the output current Io and given by VDD' and −VDD".

The equation (1) used to determine the average output positive voltage becomes:

$$Vo=(2*D-1)*VDD' \qquad (7)$$

As a function of this new relation, the limit duty-cycle (Dlimit) may be recalculated corresponding to the maximum output voltage of the input limiting stage using equation (7) instead of equation (1).

With the same steps of equations (3), (4), and (5), the following equation is obtained:

$$Dlimit=[1+G*\alpha*(VDD/VDD')]*0.5 \qquad (8)$$

Since VDD' is smaller than VDD, the real limit duty-cycle considered by equation (8) is greater than the one considered by equation (5). Moreover, the VDD' depends on the output current and on the series resistance of the high-side power device of the output stage. This in turn depends on technical and manufacturing parameters, temperature, etc.

Similar considerations may be made also for a negative output voltage −VDD", which is similarly limited by the voltage drop on the low-side power device of the output stage. Therefore, it is difficult to forecast with a sufficient precision the limit duty-cycle for any operating condition of the amplifier, and it is difficult to assure an optimal functioning of the final stage under all conditions.

SUMMARY OF THE INVENTION

In view of these difficulties, it is an object of the present invention to establish a constant limit duty-cycle substantially independent from fabrication process spreads, temperature, etc., and to assure an optimal functioning of the final stage of the amplifier for all working conditions.

A method of the invention comprises detecting the equivalent values VDD' and −VDD" of the voltages to which the output signal of the amplifier switches (or pseudo supplies). The method further includes making the limiting stage so that the voltage swing of an analog input signal utilizes the pseudo supply values VDD' and −VDD" as respective reference values to limit the voltage swings of the analog signal VL output by the input limiting stage to a pre-defined fraction α<1 of such reference values. This is done rather than using as a reference the real supply voltage values VDD and −VDD as commonly done.

In this way, the role of the input limiter stage is to limit the maximum value of the positive voltage swing to an αVDD' value, and to limit the maximum value of the negative voltage deviation to −αVDD". That is, the voltage swings are limited to threshold values that are not fixed but vary dynamically and independently from one another as a function of the real working conditions of the amplifier.

Therefore, the limit duty-cycle of the output Vop of the block that converts the analog signal which is limited in amplitude into a digital signal with an average value corresponding to the analog signal, is defined in a precise and constant way, and is substantially independent from process spreads and temperature.

This is implemented, according to an aspect of the invention, by a feedback loop formed by a circuit, having an input receiving the output signal Vop of the amplifier switching between the values VDD' and −VDD" as a function of the amplifier working conditions. The circuit divides the output signal Vop by a determined ratio a and produces through two distinct signal paths two output signals. The first signal is equivalent to αVDD' and the second signal is equivalent to −αVDD". These two dynamically varying threshold values are fed to a limiter circuit for preforming a "clipping" of the analog input signal at thresholds which are independently and dynamically generated.

BRIEF DESCRIPTION OF THE DRAWINGS

The different aspects and advantages of the invention will become even more evident through the following description of an embodiment and by referring to the attached figures, in which.

DETAILED DESCRIPTION OF THE PREFERRED EMBODIMENTS

Figure 1:
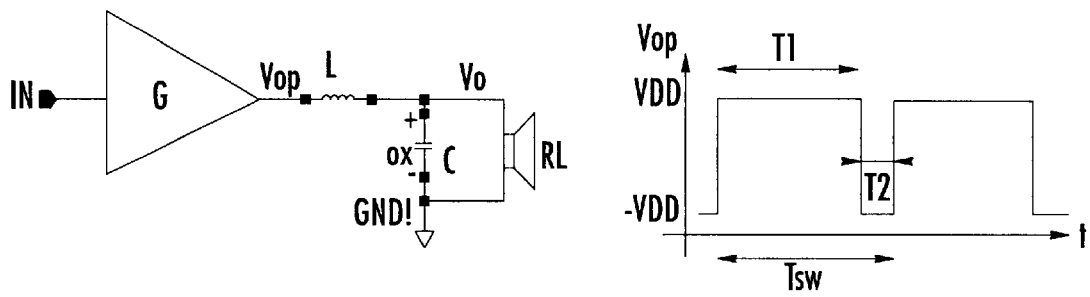
FIG. 1 is a scheme and a diagram of a class-D amplifier in accordance with the prior art.
Figure 2:
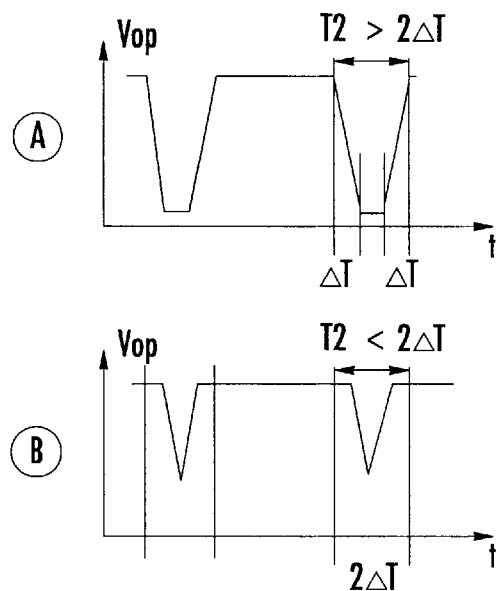
FIG. 2 shows the switching waveforms of the digital output signal provided by the class-D amplifier in FIG. 1.
Figure 3:
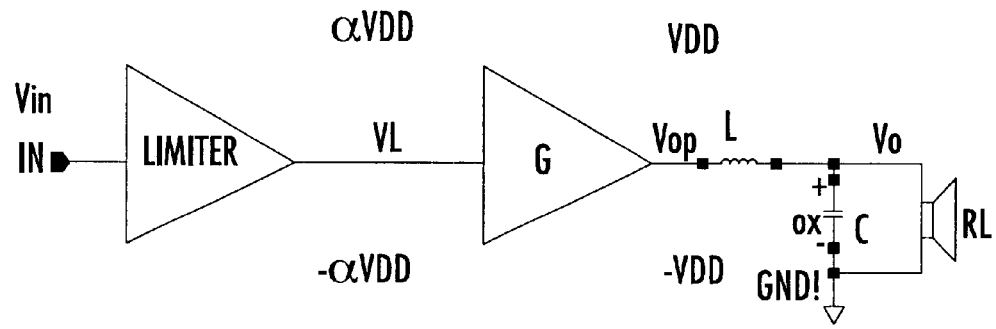
FIG. 3 is a basic scheme of the amplifier of FIG. 1 provided with an input limiter stage for the analog input signal as in the prior art.
Figure 4:
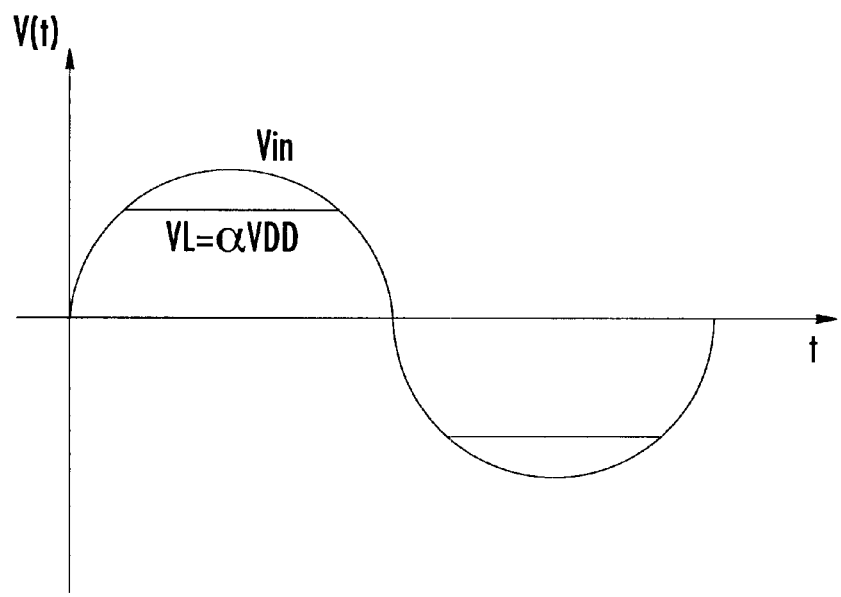
FIG. 4 shows the effect of the input limiter stage illustrated in FIG. 3.
Figure 5:
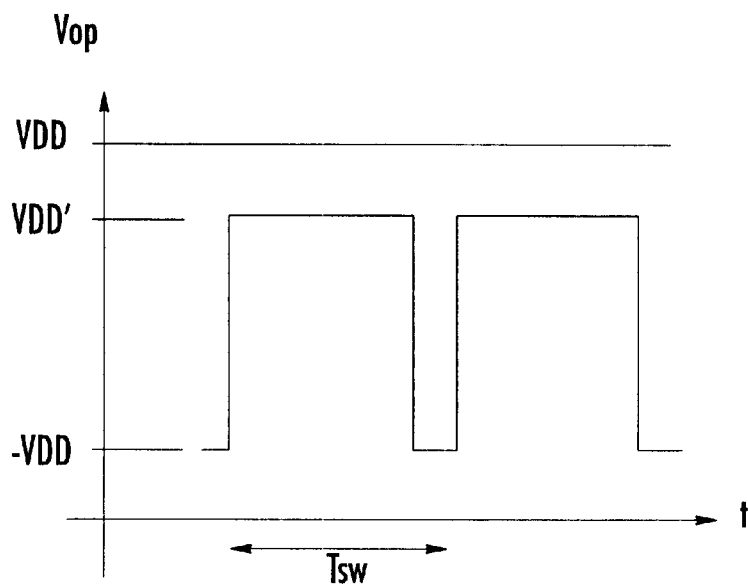
FIG. 5 is a diagram of the waveform of the digital output signal of the amplifier illustrated in FIG. 3 showing the voltage drop occurring in the final stage of the amplifier.
Figure 6:
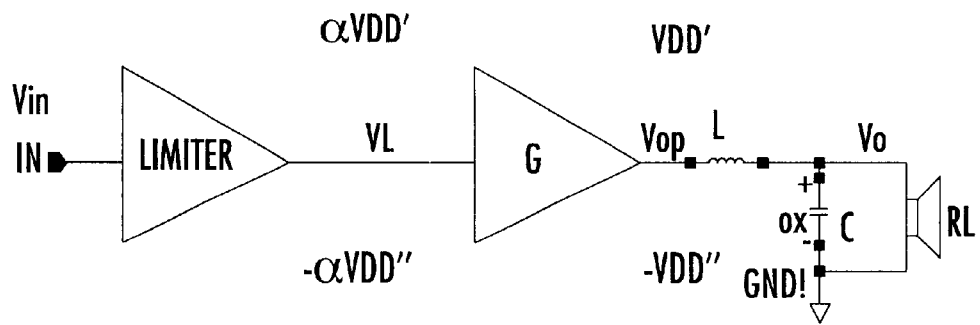
FIG. 6 is a basic scheme of a class-D amplifier which limits the amplitude of the analog input signal with a constant duty-cycle in accordance with the present invention.

With reference to the basic scheme of FIG. 6, the method of the invention limits the dynamic voltage swings of the analog input signal Vin using dynamic clipping thresholds αVDD' and −αVDD", which are independently generated. The threshold values VDD' and −VDD" correspond to the relative supply voltages VDD and −VDD decremented by the voltage drop that occurs on the series resistance of the respective power device of the half-bridge output stage of the class-D converter and amplifier circuit. Therefore, the two thresholds are generally different and depend on both the value and direction of the average current Io delivered to the load.

The scheme of FIG. 6 considers the case of a non-inverting amplifying stage with a gain G, as previously defined. The positive clipping threshold of the VL voltage output by the limiter is αVDD', while the negative clipping threshold will be −αVDD".

If the Vin input is positive and the VL voltage is limited to αVDD', the limit duty-cycle Dlimit of the output voltage Vop may be determined as follows:

$$VL\max = \alpha * VDD' \quad (9)$$

Therefore, by the same steps (3), (4), and (5) the same equation (5) for the limit duty-cycle is:

$$D\text{limit} = (1 + G * \alpha) * 0.5 \quad (10)$$

which is constant, independent from the technical parameters of the manufacturing processes or the temperature.

Figure 7:
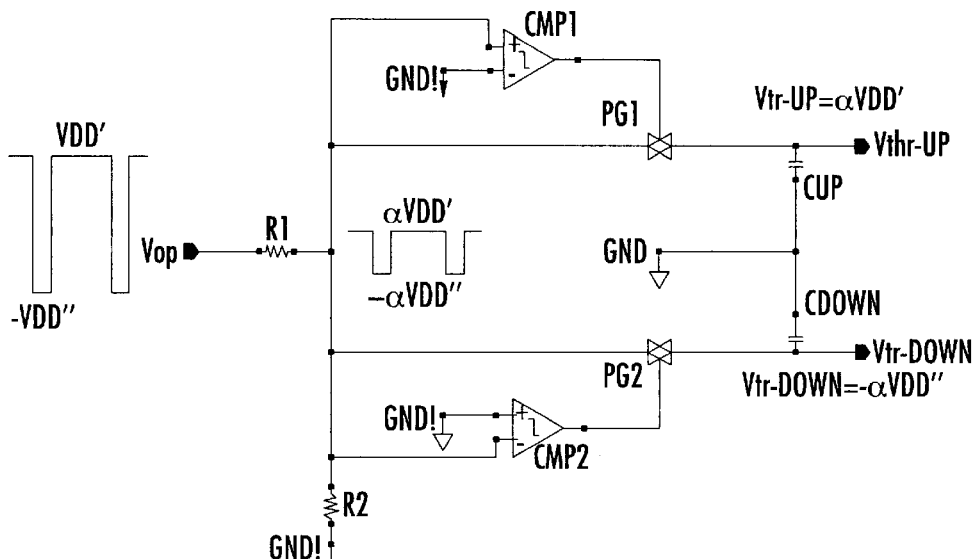
FIG. 7 shows a circuit suitable to dynamically generate limiting thresholds of the analog input signal according to the present invention.

A possible embodiment of a suitable circuit to generate the pair of dynamic reference thresholds used to limit the maximum swing of the analog input signal is depicted in FIG. 7. The output of the amplifying stage G is coupled to the circuit input. The input signal Vop of the circuit is a square wave of varying duty-cycle and with a voltage swing between the positive switching voltage VDD' and the negative switching voltage VDD".

Therefore, the digital signal applied to the Vop input already includes the voltage drops on the respective high-side and low-side power devices of the final power stage of the amplifier. The input voltage divider R1, R2 establishes the limiting factor given by:

$$\alpha = R2/(R1+R2) \quad (11)$$

The circuit defines two signal propagation paths, one toward the output onto which is dynamically generated the desired positive voltage threshold Vth-up, and the other toward the output onto which is dynamically generated the desired negative voltage threshold Vth-down. Each signal path includes a comparator, respectively CMP1 and CMP2, which compares the voltage of the intermediate node of the input divider with the ground potential GND. The ground potential GND is applied to the inverting input of the comparator CMP1 of the upper branch and to the noninverting input of the comparator CMP2 of the lower branch. The output of each comparator controls a pass-gate, respectively PG1 and PG2, which controls the charge and the discharge of a respective output capacitor, Cup and Cdown.

The functioning is easily comprehended. When the digital signal Vop is high, its voltage level is at VDD'. The comparator CMP1 has a high output and, therefore, the pass-gate PG1 is closed. The Vth-up voltage on the output capacitance Cup is in a phase of acquisition of the voltage value αVDD'. During this phase, the other comparator CMP2 has a low output. The pass-gate PG2 is open and the Vth-down voltage is on a hold phase of the voltage value previously acquired.

When the input digital signal Vop is low, its voltage value is at −αVDD". The comparator CMP1 has a low output and, therefore, the PG1 is open. The Vth-up voltage on the output capacitance Cup retains the value previously acquired at αVDD'. On the contrary, during this phase, the Vth-down voltage is in a phase of acquisition of the negative value −αVDD". Therefore, the circuit generates two thresholds, Vth-up and Vth-down, respectively, which track, independently from one another, αVDD' and −αVDD", respectively.

Figure 8:
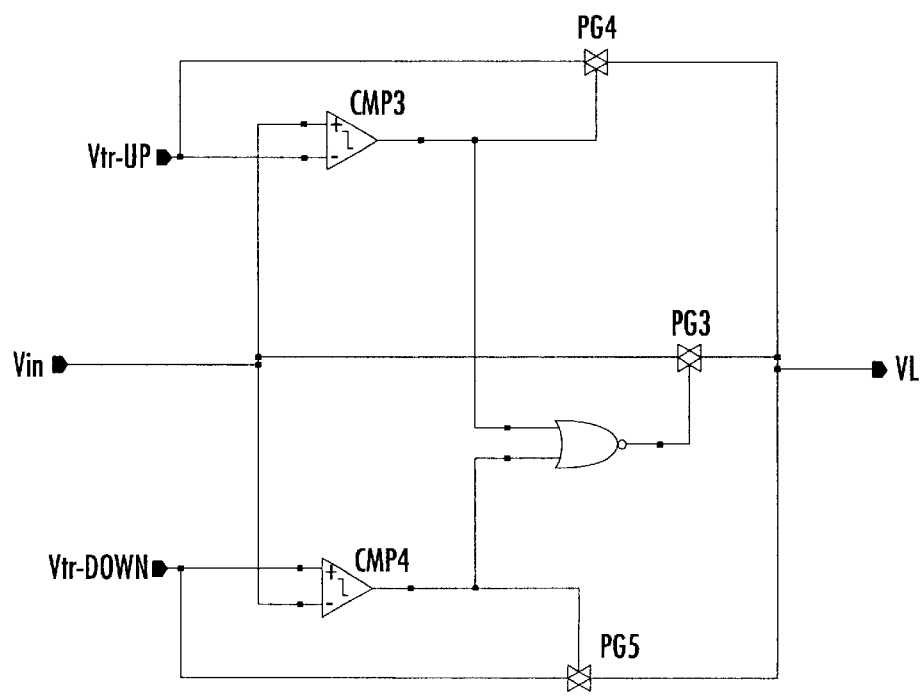
FIG. 8 shows the limiting circuit for the analog input signal using the dynamically generated threshold values produced by the circuit of FIG. 7.

The two dynamically varying and independent thresholds are fed to a limiter circuit input which performs a clipping at these dynamic threshold values: Vth-up and Vth-down. The limiter circuit may be realized in the form shown in FIG. 8.

When the analog input signal Vin has a level between the two thresholds Vth-up and Vth-down, both comparators CMP3 and CMP4 have a low output and the pass-gate PG3 is closed while the other two pass-gates PG4 and PG5 are open. Therefore the output of the limiter stage VL is equal to the input Vin.

Assuming that the input Vin becomes higher than the threshold Vth-up, the CMP3 output becomes high and, therefore, the pass-gate PG4 is closed while the pass-gate PG3 opens. Therefore, the output VL coincides with the high threshold value Vth-up. In contrast, when Vin becomes lower than the low threshold Vth-down, VL is equal to the low threshold Vth-down. A clipping of the VL voltage to the respective instantaneous values of Vth-up and Vth-down is thus achieved.

That which is claimed:

1. A method for limiting duty-cycle in a class-D amplifier comprising:
    limiting a maximum amplitude of an analog input signal;
    amplifying the amplitude limited analog input signal using an amplifier for providing a digital output signal switching between two voltages, each switched voltage corresponding to a voltage of a respective supply rail of an output power stage of the amplifier less a voltage drop on a respective power device therein, with an average value representing an amplified replica of the amplitude limited analog input signal;
    regenerating an amplified analog signal using a low pass filter;
    feeding the digital output signal to an input of a threshold limiting circuit for generating a positive threshold voltage and a negative threshold voltage, each threshold voltage corresponding to a pre-defined fraction of the respective switched voltages that the digital output signal switches to; and
    limiting the maximum amplitude of the analog input signal to the positive threshold voltage and the negative threshold voltage.

2. A method according to claim 1, further comprising defining two signal paths in the threshold limiting circuit for a digital signal present on an intermediate node of a voltage divider coupled to an output of the amplifier, the two signal paths being directed towards respective outputs onto which are generated the positive and negative threshold voltages.

3. A method according to claim 2, wherein each signal path in the threshold limiting circuit includes a comparator, a pass-gate connected thereto, and a switched output capacitor connected to the pass-gate.

4. A method according to claim 3, wherein each comparator controls a respective pass-gate, and a respective switched output capacitor is electrically connected between the respective output and a common ground node.

5. A method according to claim 3, wherein the comparator in the signal path being defined towards the output onto which is generated the positive threshold voltage has a noninverting input connected to the intermediate node of the input voltage divider, and an inverting input node connected to ground.

6. A method according to claim 3, wherein the comparator in the signal path being defined towards the output onto which is generated the negative threshold voltage has an inverting input connected to the intermediate node of the input voltage divider, and a noninverting input node connected to ground.

7. A method for limiting a duty-cycle in a class-D amplifier comprising:
    limiting a maximum amplitude of an analog input signal;
    amplifying the amplitude limited analog input signal for providing a digital output signal switching between two voltages;
    regenerating an amplified analog signal;
    generating a first threshold voltage and a second threshold voltage by feeding the digital output signal to an input of a threshold limiting circuit, each threshold voltage corresponding to a pre-defined fraction of the respective switched voltages that the digital output signal switches to; and
    limiting the maximum amplitude of the analog input signal to the first threshold voltage and the second threshold voltage.

8. A method according to claim 7, wherein the first threshold voltage is a positive voltage and the second threshold voltage is a negative voltage.

9. A method according to claim 7, wherein amplifying is performed using an amplifier for providing the digital output signal switching between two voltages, each switched voltage corresponding to a voltage of a respective supply rail of an output power stage of the amplifier less a voltage drop on a respective power device therein.

10. A method according to claim 9, wherein an average value of each switched voltage represents an amplified replica of the amplitude limited analog input signal.

11. A method according to claim 7, wherein the step of regenerating is performed using a low pass filter.

12. A method according to claim 7, wherein the threshold limiting circuit is connected to an output of an amplifier, the method further comprising the step of defining two signal paths in the threshold limiting circuit for a digital signal present on an intermediate node of a voltage divider coupled to an output of the amplifier, the two signal paths being directed towards respective outputs onto which are generated the first and second threshold voltages.

13. A method according to claim 12, wherein each signal path in the threshold limiting circuit includes a comparator, a pass-gate connected thereto, and a switched output capacitor connected to the pass-gate.

14. A method according to claim 13, wherein each comparator controls a respective pass-gate, and a respective switched output capacitor is electrically connected between the respective output and a common ground node.

15. A method according to claim 13, wherein the comparator in the signal path being defined towards the output onto which is generated the first threshold voltage has a noninverting input connected to the intermediate node of the input voltage divider and an inverting input node connected to ground.

16. A method according to claim 13, wherein the comparator in the signal path being defined towards the output onto which is generated the second threshold voltage has an inverting input connected to the intermediate node of the input voltage divider and a noninverting input node connected to ground.

17. A class-D amplifier system having a limited duty-cycle comprising:
    a limit circuit for limiting a maximum amplitude of an analog input signal, said limit circuit including a first input for receiving the analog input signal, a second input for receiving a positive threshold voltage, and a third input for receiving a negative threshold voltage;
    an amplifier stage connected to an output of said limit circuit and comprising an output power stage including high-side and low-side power devices for outputting a digital signal switching between two voltages, each switched voltage corresponding to a voltage of a respective supply rail of the output power stage less a voltage drop on a respective power device, and with an average value representing an amplified replica of an amplitude limited analog input signal;
    a low pass filter connected to an output of said amplifier stage; and
    a threshold limiting circuit connected to the output of said amplifier stage for generating the positive threshold voltage and the negative threshold voltage as a pre-established fraction of the respective switching voltages of the digital output signal provided by said amplifier stage.

18. A class-D amplifier system according to claim 17, wherein said threshold limiting circuit comprises an input voltage divider coupled to the output of said amplifier stage for defining two signal paths for a digital signal present on an intermediate node of said input voltage divider, the two signal paths being defined towards two respective outputs onto which are generated the positive and negative threshold voltages.

19. A class-D amplifier system according to claim 18 wherein said threshold limiting circuit comprises within each signal path a comparator, a pass-gate connected thereto, and a switched output capacitor connected to said pass-gate.

20. A class-D amplifier system according to claim 19, wherein each comparator controls a respective pass-gate, and a respective switched output capacitor is electrically connected between the respective output and a common ground node.

21. A class-D amplifier system according to claim 19, wherein the comparator of the signal path being defined towards the output onto which is generated the positive threshold voltage has a noninverting input connected to the intermediate node of said input voltage divider and an inverting input node connected to ground.

22. A class-D amplifier system according to claim 19, wherein the comparator of the signal path being defined towards the output onto which is generated the negative threshold voltage has an inverting input connected to the intermediate node of said input voltage divider and a noninverting input node connected to ground.

23. A class-D amplifier system having a limited duty-cycle comprising:
    a limit circuit for limiting a maximum amplitude of an analog input signal, said limit circuit including a first input for receiving the analog input signal, a second input for receiving a first threshold voltage, and a third input for receiving a second threshold voltage;
    an amplifier stage connected to an output of said limit circuit for outputting a digital signal switching between two voltages;
    a low pass filter connected to the output of said amplifier stage; and a threshold limiting circuit connected to the output of said amplifier stage for generating the first and second threshold voltages as a pre-established fraction of the respective switching voltages of the digital output signal provided by said amplifier stage.

24. A class-D amplifier system according to claim 23, wherein the first threshold voltage is a positive threshold voltage, and the second threshold voltage is a negative threshold voltage.

25. A class-D amplifier system according to claim 23, wherein said amplifier stage comprises an output power stage including high-side and low-side power devices for outputting the digital signal switching between two voltages.

26. A class-D amplifier system according to claim 25, wherein each switched voltage corresponds to a voltage of a respective supply rail of the output power stage less a voltage drop on a respective power device.

27. A class-D amplifier system according to claim 26, wherein each switched voltage has an average value representing an amplified replica of the amplitude limited analog input signal.

28. A class-D amplifier system according to claim 23, wherein said threshold limiting circuit comprises an input voltage divider coupled to the output of said amplifier stage for defining two signal paths for a digital signal present on an intermediate node of said input voltage divider, the two signal paths being directed towards two respective outputs onto which are generated the first and second threshold voltages.

29. A class-D amplifier system according to claim 28, wherein said threshold limiting circuit comprises within each signal path a comparator, a pass-gate connected thereto, and a switched output capacitor connected to said pass-gate.

30. A class-D amplifier system according to claim 29, wherein each comparator controls a respective pass-gate, and a respective switched output capacitor is electrically connected between the respective output and a common ground node.

31. A class-D amplifier system according to claim 29, wherein the comparator of the signal path being defined towards the output onto which is generated the first threshold voltage has a noninverting input connected to the intermediate node of said input voltage divider and an inverting input node connected to ground.

32. A class-D amplifier system according to claim 29, wherein the comparator of the signal path being defined towards the output onto which is generated the second threshold voltage has an inverting input connected to the intermediate node of said input voltage divider and a noninverting input node connected to ground.

* * * * *